US005811215A

United States Patent [19]

Van Damme et al.

[11] Patent Number: 5,811,215

[45] Date of Patent: Sep. 22, 1998

[54] AQUEOUS SILICATE TREATMENT METHOD FOR PREPARING A HYDROPHILIC SURFACE OF AN LITHOGRAPHIC PRINTING PLATE ALUMINUM BASE

[75] Inventors: Marc Van Damme, Heverlee; Joan Vermeersch, Deinze, both of Belgium

[73] Assignee: Agfa-Gevaert, N.V., Mortsel, Belgium

[21] Appl. No.: 826,230

[22] Filed: Mar. 27, 1997

[30] Foreign Application Priority Data

Apr. 3, 1996 [EP] European Pat. Off. .............. 96200906

[51] Int. Cl.[6] .............................. G03F 7/07; G03F 7/039; G03F 7/09; G03F 7/34

[52] U.S. Cl. .......................... 430/201; 430/200; 430/204; 430/278.1; 430/253; 430/254; 430/964; 205/203; 205/153; 205/214; 205/220; 205/223; 148/275; 148/276; 148/285; 101/459

[58] Field of Search .................................... 430/200, 201, 430/204, 278.1, 254, 253; 205/203, 224, 214, 153, 220; 148/275, 276, 285; 101/459

[56] References Cited

U.S. PATENT DOCUMENTS

| | | | |
|---|---|---|---|
| 3,174,916 | 3/1965 | Cohn | 205/203 |
| 3,181,461 | 5/1965 | Fromsom | 430/278.1 |
| 3,861,917 | 1/1975 | Magnotta et al. | 430/278.1 |
| 4,116,695 | 9/1978 | Mori et al. | 430/278.1 |
| 4,175,964 | 11/1979 | Uchida et al. | 430/253 |
| 4,492,616 | 1/1985 | Plieke et al. | 430/278.1 |
| 5,122,443 | 6/1992 | Takeda | 430/204 |
| 5,278,023 | 1/1994 | Bills et al. | 430/204 |
| 5,550,002 | 8/1996 | Kojima et al. | 430/278.1 |
| 5,556,531 | 9/1996 | Wiedemann | 430/278.1 |
| 5,688,629 | 11/1997 | Gries | 430/254 |

*Primary Examiner*—Richard L. Schilling
*Attorney, Agent, or Firm*—Breiner & Breiner

[57] ABSTRACT

According to the present invention there is provided a method for preparing a hydrophilic surface of an aluminum lithographic base comprising the steps of roughening and anodizing a side of an aluminum foil and sealing said side of the aluminum foil with hot water within a temperature range from 70° C. to 100° C. for at least 5 seconds and rinsing said side of the aluminum foil with water characterized in that between said hot water treatment and said rinsing said side of the aluminum foil is treated with an aqueous silicate solution within a temperature range from 70° C. to 100° C. for at least 5 seconds.

11 Claims, No Drawings

AQUEOUS SILICATE TREATMENT METHOD FOR PREPARING A HYDROPHILIC SURFACE OF AN LITHOGRAPHIC PRINTING PLATE ALUMINUM BASE

FIELD OF THE INVENTION

The present invention relates to a method for preparing a hydrophilic surface of a lithographic aluminum base suitable for use as a support for an imaging element for making a printing plate.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography respectively thermolithography, a photographic respectively thermographic material is made imagewise receptive to oily or greasy ink in the photo-exposed respectively thermo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive respectively a thermosensitive composition. Coatings for a photosensitive composition include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas and then rinsed with water.

Coatings for a thermosensitive composition are described f.i. in EP-A-95202874.4. Here too, upon imagewise exposure of the thermo-sensitive layer the exposed image areas become insoluble and the unexposed areas remain soluble. The plate is then developed with a suitable liquid to remove the thermo-sensitive composition in the unexposed areas and then rinsed with water.

During the development and rinsing of the above mentioned photosensitive or thermosensitive lithographic plate precursors there is generated a great deal of liquid (diluted) waste. A completely dry preparation of lithographic plates by photodelamination, wherein the removable areas of the photosensitive layer are not dissolved in a developer, but are in a dry way transferred to a thin receptor foil would be easier and also preferred from an ecological point of vue. Such a process is disclosed in EP-A-502562, 522616, 653684, 653685, 95201017.1, 95202291.7 and 95202725.8. In a possible alternative for this principle thermodelamination is used wherein the change in adhesion is thermally induced in stead of photochemically. Such a process is disclosed in EP-A-95203494.0

This dry method for preparing printing plates has for the customer two big advantages. It avoids contact of the customer with chemical liquids, which can contain harmful compounds and the impact on the environment is minimized because the chemical waste is collected in solid, highly concentrated form and can eventually be recycled.

A preferred support for lithographic printing plates is a roughened and anodized aluminum support. In using a photosensitive or thermosensitive lithographic printing plate precursor suitable for processing by a lamination/delamination process and comprising a roughened and anodized aluminum support the following problem occurs. In forming an image by peeling off after image-wise exposure, when the areas of the photosensitive or thermosensitive layer which have a greater adhesion force to the receptor layer are removed together with the receptor layer, a part of the areas to be peeled off together with the receptor layer remains on the roughened and anodized support (the hydrophilic surface of the lithographic base). Therefore, where the material so produced is used as a plate for lithographic printing, printing ink adheres even to non-image areas, causing background smearing, and thus this material is not practically usable. It is thus impossible to process by lamination and delamination a lithographic printing plate precursor comprising a roughened and anodized support so that said support is obtained free of stain without using special measures.

GB 1.530.410 discloses a photosensitive material which can be processed by delamination comprising in the order given: i) an anodized aluminum support, ii) a hydrophilic organic polymer coating, iii) a photosensitive layer, iv) a transparent cover film. However the result is still not completely satisfactory and there remains room for improvement.

SUMMARY OF THE INVENTION

It is an object of the present invention to provide a method for preparing a roughened and anodized aluminum support which, when used as support in a photosensitive or a heat sensitive lithographic printing plate precursor which is after image-wise exposure processed by lamination/delamination will yield a hydrophilic surface of an aluminum lithographic base free of stain.

Further objects of the present invention will become clear from the description hereinafter.

According to the present invention there is provided a method for preparing a hydrophilic surface of an aluminum lithographic base comprising the steps of roughening and anodizing a side of an aluminum foil and sealing said side of the aluminum foil with hot water within a temperature range from 70° C. to 100° C. for at least 5 seconds and rinsing said side of the aluminum foil with water characterized in that between said hot water treatment and said rinsing said side of the aluminum foil is treated with an aqueous silicate solution within a temperature range from 70° C. to 100° C. for at least 5 seconds.

DETAILED DESCRIPTION OF THE INVENTION

It has been found that lithographic printing plates without stain can be obtained when an exposed photosensitive respectively thermosensitive lithographic printing plate precursor comprising a roughened and anodized aluminum support and capable of processing by a lamination/delamination process is processed by a lamination/delamination process if said aluminum support is treated according to the method of the present invention. More precisely it has been found that said printing plates are of high quality and are provided in a convenient way, thereby offering economical and ecological advantages.

The roughened and anodized side of the aluminum foil is after sealing said side of said aluminum foil with hot water in the temperature range from 70° C. to 100° C. for at least 5 seconds and before rinsing said side of said aluminum foil with water treated with an aqueous silicate solution within a temperature range preferably from 80° C. to 95° C., more preferably of about 90° C. for at least 5 seconds, preferably for a time between 10 seconds and 600 seconds, more preferably for a time between 30 seconds and 500 seconds, most preferably for a time of about 300 seconds. The amount of silicate compound in said aqueous silicate solution is preferably from 0.5% by weight to 10% by weight, more preferably from 1.25% by weight to 3.75% by weight. Said aqueous silicate solution is preferably a potassium silicate solution, more preferably a sodium silicate solution. The weight ratio of $SiO_2$ versus $Na_2O$ in said sodium silicate solution is preferably between 2 and 3.35, more preferably between 3 and 3.35.

The aluminum support is a roughened and anodized aluminum foil which has been sealed with hot water.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like $H_2SO_4$, $H_3PO_4$, that if desired, contain additionally one or more corrosion inhibitors such as $Al(NO_3)_3$, $AlCl_3$, boric acid, chromic acid, sulphates, chlorides, nitrates, monoamines, diamines, aldehydes, phosphates, $H_2O_2$, etc.

Electrochemical graining in connection with the present invention can be performed using single-phase and three-phase alternating current. The voltage applied to the aluminum plate is preferably 10–35 V. A current density of 3–150 $Amp/dm^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulphuric acid, phosphoric acid, oxalic acid, chromic acid or organic acids such as sulphamic, benzosulphonic acid, etc. or mixtures thereof. An electrolyte concentration from 1 to 70% by weight can be used within a temperature range from 0°–70° C. The anodic current density may vary from 1–50 $A/dm^2$ and a voltage within the range 1–100 V to obtain an anodized film weight of 1–8 $g/m^2$ $Al_2O_3.H_2O$.

The roughened and anodized side of the aluminum foil is subsequently sealed with hot water, preferably with hot demineralised water within a temperature range from 70° C. to 100° C., preferably from 85° C. to 95° C., more preferably with a temperature of about 90° C. for at least 10 seconds, preferably for 20 seconds to 200 seconds, more preferably for 25 seconds to 120 seconds.

After the treatment of the roughened, anodized and sealed aluminum foil with an aqueous silicate solution within a temperature range from 70° C. to 100° C. for at least 30 seconds said aluminum foil is rinsed with water, preferably demineralized water in the temperature range preferably from 10° C. to 40° C. for a time preferably being at least 5 seconds. A hydrophilic surface of a lithographic aluminum base is so obtained.

In one embodiment of the present invention an imaging element is obtained comprising a lithographic aluminum base having a hydrophilic surface prepared according to the invention and a hydrophobic photosensitive or thermosensitive composition applied thereto.

According to the present invention there is provided a method for obtaining a lithographic plate by the following steps:

i) preparing an imaging element as described above, ii)image-wise or information-wise exposing said imaging element to actinic radiation, iii) laminating said imaging element with its photosensitive or thermosensitive side to a receptor element or layer before or after said exposure and iv) peeling away the receptor element from the hydrophilic surface of the lithographic aluminum base thus transferring said hydrophobic photosensitive or thermosensitive composition patternwise to the receptor element or layer.

In one preferred embodiment an imaging element is provided comprising a lithographic aluminum base having a hydrophilic surface prepared according to the invention and applied thereto a hydrophobic photopolymerizable composition comprising at least one monomer, at least one polymeric binder and at least one photoinitiator and on top of said photopolymerizable composition one or more transparent protective layers, one of them being an upper layer, selected from the group consisting of:

a transfer layer which is capable of adhering to the underlying contiguous layer and to a receptor layer, and a receptor layer which is capable of adhering to the underlying contiguous layer and which is upperlying said transfer layer(s) if any is present.

There is also provided a method for obtaining a lithographic printing plate with said imaging element comprising the steps of:

i) preparing an imaging element as described above, ii)image-wise or information-wise exposing said imaging element to actinic radiation, iii) laminating said imaging element with its photosensitive or thermosensitive side to a receptor element or layer before or after said exposure and iv) peeling away the receptor element from the hydrophilic surface of the lithographic aluminum base thus transferring said hydrophobic photosensitive or thermosensitive composition patternwise to the receptor element or layer.

The at least one monomer comprised in said photopolymerizable composition can be a monomer having at least one polymerizable ethylenically unsaturated group. Monomers containing at least two polymerizable ethylenically unsaturated groups are preferably used. Particularly preferred are urethane type monomers, such as the compounds of table I and those disclosed in EP-A 502562 and unsaturated esters of polyols, especially esters of polyols and an alpha-methylene carboxylic acid.

Examples of urethane type monomers are given in table I.

composition are disclosed in EP-A 522,616. It will be clear that these monomers can be used in admixture.

In general, the photopolymerizable composition also comprises at least one photoinitiator, which can be a single compound or a composition. Preferably used photoinitiators are polymerization initiators activatable by actinic light and inactive at and below the storing conditions of the photosensitive material. Examples of such initiators are disclosed in EP-A 522,616 which therefor is incorporated herein by reference.

A particularly preferred photoinitiator is a composition comprising a hexaarylbisimidazole, a tetraalkyldiaminobenzophenone e.g. Michler's ketone and a chain transfer agent (also called a hydrogen donor) e.g. 2-mercaptobenzoxazole as disclosed in EP-A 437,259.

An even more preferred photoinitiator for use in the present invention is a composition comprising a triazinoderivate containing at least 2 trihalogenomethyl groups and optionally comprising a sensitizer e.g. Michler's ketone or thioxantone.

According to the present invention thermal polymerization inhibitors may also be added to the photopolymerizable

TABLE I

1. 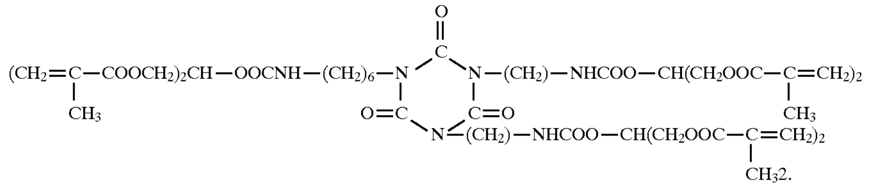

2. $C_2H_5-C[CH_2O-CO-NH-(CH_2)_6-NH-COO-CH(CH_2-O-CO-C(CH_3)=CH_2)_2]_3$

3. $C[CH_2O-CO-NH-(CH_2)_6-NH-COO-CH(CH_2-O-CO-C(CH_3)=CH_2)_2]_4$

4. 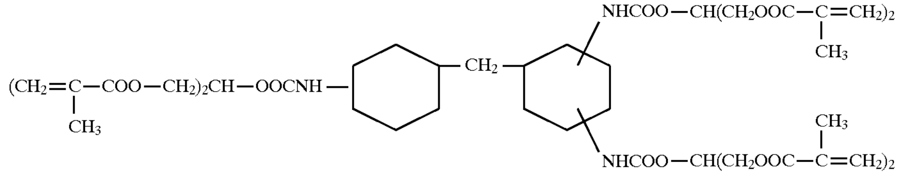

5. 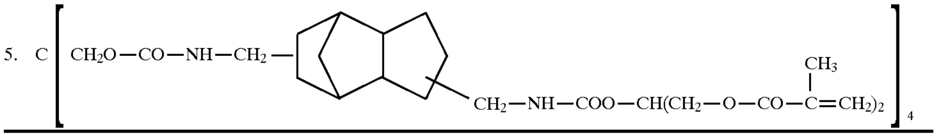

Examples of esters of a polyol and an alpha-methylene carboxylic acid are: ethylene diacrylate, glycerol tri(meth) acrylate, ethylene dimethacrylate, 1,3-propanediol di(meth) acrylate, 1,2,4-butanetriol tri(meth)acrylate, 1,4-cyclohexanediol di(meth)acrylate, 1,4-benzenediol di(meth) acrylate, pentaerythritol tetra(meth)acrylate, dipentaerythritol pentaacrylate, 1,5-pentanediol di(meth) acrylate, the bis acrylates and methacrylates of polyethylene glycols of molecular weight 200–500, and the like.

Other types of monomers suitable for use in the photopolymerizable composition are e.g. the monomers disclosed in EP-A 502562, DEOS no. 4,109,239, 4,005,231, 3,643, 216, 3,625,203, 3,516,257, 3,516,256 and 3,632,657, which therefor are incorporated herein by reference. Further types of monomers suitable for use in the photopolymerizable composition. Examples of inhibitors for use in accordance with the present invention are disclosed in EP-A 522,616 which therefor is incorporated herein by reference.

According to a preferred mode the hydrophobic photopolymerizable composition comprising at least one monomer and at least one polymeric binder comprises as polymeric binder a thermoplastic polymer. Suitable thermoplastic polymers for use in accordance with the present invention are disclosed e.g. in EP-A 522,616 which therefor is incorporated herein by reference.

To the hydrophobic photopolymerizable composition there can also be added non-thermoplastic polymeric compounds to give certain desirable characteristics, e.g. to improve adhesion to said hydrophilic surface of a lithographic aluminum base used in accordance with the present invention, wear properties, chemical inertness, etc. Suitable non-thermoplastic polymeric compounds include cellulose, phenolic resins and melamine-formaldehyde resins, etc. If desired, the photopolymerizable compositions can also contain immiscible polymeric or non-polymeric organic or inorganic fillers or reinforcing agents which are essentially transparent at the wave-lengths used for the exposure of the photopolymeric material, e.g. organophilic silicas, bentonites, silica, powdered glass, colloidal carbon, as well as various types of dyes and pigments in amounts varying with the desired properties of the photopolymerizable composition. The fillers are useful in improving the strength of the composition, reducing tack and in addition, as coloring agents.

Agents to improve the wetting and/or adjust the adhesion of the photopolymerizable composition may be added. Suitable agents are e.g. silicons, silicon containing polymers e.g. a poly(dimethylsiloxane)-polyether copolymer, poly (dimethylsiloxane)-polyester, silicon containing surfactants, fluor containing copolymers and fluor containing surfactants etc.

Various dyes, pigments, thermographic compounds, UV-absorbers, anti-oxidants and color forming components as disclosed in EP-A 522,616 can be added to the photopolymerizable compositions to give a variety of images after the processing. These additive materials, however, preferably should not absorb excessive amounts of light at the exposure wavelength or inhibit the polymerization reaction.

The protective layer may be a transfer layer, which is capable of adhering to the underlying contiguous layer and to a receptor layer, such as a thermo-adhesive layer or a pressure-adhesive layer.

Suitable thermo-adhesive layers (TALs) for use in the present invention have a glas transition temperature $T_g$ between 10° C. and 100° C. as measured with the 1090 THERMOANALYZER of Du Pont Co. During the lamination and delamination step a minimal thermal load should be imposed to the material in order to save energy and diminish the risk for material change or deformation. For these reasons the $T_g$ of the TAL is preferably below 60° C. The $T_g$ value of the TAL can be determined by the $T_g$ value of the polymer(s) used and/or by the addition of polymeric or low-molecular plasticizers or thermosolvents.

The adherance of the TAL to the receptor layer is also determined by the flow properties of the TAL while heating above the $T_g$. A parameter for describing this property is the melt viscosity. A TAL for use in accordance with the present invention has a melt viscosity of more than 3000 Poise measured at 120° C. with the VISCOELASTIC MELT TESTER of Rheometrics Co, Surrey, UK.

In order to induce easy film formation without unwanted sticking of the TAL to the backside of the imaging medium or to other materials a TAL is preferably used with a $T_g$ value between 20° C. and 45° C., a melt viscosity greater than 7000 Poise and an elasticity corresponding to a $(\text{tg}\ \delta)^{-1}$ value greater than 1.30 measured at 120° C. with the VISCOELASTIC MELT TESTER of Rheometrics Co, Surrey, UK. The $(\text{tg}\ \delta)^{-1}$ value is a measure for the elasticity as described in "Polymer Chemistry: the Basic Concept" by P. C. Hiemenz, 1984, edit. by M. Dekker Inc., New York.

For ecological and practical reasons the TAL is preferably coated from an aqueous medium. Therefore the polymers are preferably incorporated as latices.

Preferred latices are latices of styrene, styrene-butadiene, styrene-(meth)acrylate and n.butylacrylate-methylmethacrylate-acrylonitrile. These latices can contain other comonomers which improve the stablitity of the latex, such as acrylic acid, methacrylic acid and acrylamide. Other possible latices include polyvinylacetate, polyethylene-vinylacetate, polyacrylonitrile-butadiene-acrylic acid, polymethylmethacrylate-butylmethacrylate, polymethylmethacrylate-ethylacrylate, polystyrene-butylacrylate, polymethylmethacrylate-butadiene, polyester of terephtalic acid-sulphoisophtalic acid-ethyleneglycol, copolyester of terephtalic acid-sulphoisophtalic acid-hexanediol-ethyleneglycol.

Particularly suitable polymers for use in the TAL layer are the BAYSTAL polymer types, marketed by Bayer AG, Germany, which are on the basis of styrene-butadiene copolymers with a weight ratio between 40/60 and 80/20. If desired a few weight % (up to about 10%) of acrylamide and/or acrylic acid can be included. Other useful polymers are the EUDERM polymers, also from Bayer AG, which are copolymers comprising n.-butylacrylate, methylmethacrylate, acrylonitrile and small amounts of methacrylic acid.

Various additives can be present in the TAL to improve the layer formation or the layer properties, e.g. thickening agents, surfactants, levelling agents, thermal solvents and pigments.

Apart from the thermo-adhesive layer to which the receptor layer will be laminated and which must comply with the requirements described above the material can contain one or more supplementary thermo-adhesive layer(s) positioned between the upper TAL and the hydrophobic photopolymerizable composition e.g. to optimize the adherance to the hydrophobic photopolymerizable composition in view of obtaining a better image quality after the delamination process. This (these) other TAL(s) can have a composition and/or physical properties different from those imposed to the upper TAL. This (these) layer(s) can contain one polymer or a mixture of polymers, optionally in combination with low-molecular additives like plasticizers or thermosolvents. Other ingredients which can be incorporated include waxes, fillers, polymer beads, glass beads, silica etc.

Suitable pressure-adhesive layers (PALs) for use in the present invention comprise one or more pressure sensitive adhesives. Said pressure sensitive adhesives are preferably tacky elastomers e.g. block copolymers of styrene/isoprene, styrene/butadiene rubbers, butyl rubbers, polymers of isobutylene and silicones. Particularly preferred are natural rubbers and acrylate copolymers as disclosed in U.S. Pat. No. 3,857,731. The used pressure sensitive adhesive preferably has a continuous-coat (100% coverage) peel adhesion value, when applied to untreated paper, between 1 and 10 N/cm width, more preferably between 2 and 7 N/cm width.

The pressure-adhesive layer comprising a pressure sensitive adhesive may contain a binder. Suitable binders for use in combination with the pressure sensitive adhesives are binders that are inert towards the pressure sensitive adhesives i.e. they do not chemically attack the pressure sensitive adhesives or act as a solvent for them. Examples of such binders are nitrocellulose, urethanes, gelatin, polyvinyl alcohol etc.

The amount of binder should be chosen such that the pressure sensitive adhesives are effectively anchored to the hydrophobic photopolymerizable composition. Preferably the amount of binder is lower than 2.5 parts by weight with respect to the pressure sensitive adhesives and more preferably lower than 0.6.

The pressure-adhesive layer comprising a pressure sensitive adhesive may also contain a tackyfier e.g. rosin soap or a terpene.

The imaging element containing a pressure-adhesive layer comprises preferably also a receptor element on top of said pressure-adhesive layer. In general said receptor element is(are) (a) transparent layer(s) contiguous to said pressure-adhesive layer e.g. a transparent organic resin layer.

The thickness of the transfer layer is important for the adherence during the lamination/delamination process. Preferably the thickness of said transfer layer lies between 0.1 and 30 $\mu$m, more preferably between 0.1 and 15 $\mu$m.

The protective layer according to the invention can also be a receptor layer which is capable of adhering to the underlying contiguous layer and which is upperlying the transfer layer(s) if any is present. Said receptor layer is preferably stable at the processing conditions. The particular layer used is a transparent organic resins e.g. cellulose esters such as cellulose acetate, cellulose propionate and cellulose butyrate, polyvinyl acetals, polystyrene, polycarbonate or polyvinylchloride. Preferred receptor layers are films of polyesters such as polyethylene terephthalate or of poly-Alpha-olefins such as polyethylene or polypropylene.

A receptor element according to the invention comprises at least a receptor layer. The particular layer used is dependent on the nature of the composition of the imaging element. When said receptor layer is applied to the imaging element before its exposure, it has to be a transparent organic resin as mentioned above. When said receptor layer is applied to the imaging element after its exposure, suitable receptor layers include paper; poly-Alpha-olefin coated paper; cardboard; metal sheets; foils and meshes e.g. aluminium, copper, steel, bronze etc.; transparent organic resins; opaque foamed or pigmented polyester; silk; cotton and viscose rayon fabrics or screens. Preferred receptor layers are commercially available paper brands as disclosed in PCT/EP 94/02063, which therefor is incorporated herein by reference and films of polyesters such as polyethylene terephthalate or of poly-Alpha-olefins such as polyethylene or polypropylene.

Said receptor element may further comprises a thin additional layer. Examples of such receptor elements are supports provided with a thin metal layer e.g. polyester supports provided with a vapour deposited metal layer and most useful polyethylene coated paper. A receptor element may also comprise (a) additional layer(s) such as (a) backing layer(s).

In another preferred embodiment, said receptor element comprises as the receptor layer an adhesive layer applied on a flexible support. Suitable adhesive layers and flexible supports are described hereinbefore.

The imaging element may be prepared by coating the layers on each other or by laminating layers or packets of layers to each other.

In a practical embodiment the imaging element is prepared by the following steps:

coating on said hydrophilic surface of a lithographic aluminum base in accordance with the present invention (i) a hydrophobic photopolymerizable composition comprising at least one monomer and at least one polymeric binder and (ii) a thermo-adhesive layer with optionally an underlying pressure-adhesive layer.

In another practical embodiment the imaging element is prepared by laminating the above described imaging element with its thermo-adhesive layer onto a receptor layer or onto a pressure-adhesive layer coated on a receptor layer.

In still another practical embodiment the imaging element is prepared by the following steps:

coating on a hydrophilic surface of a lithographic aluminum base in accordance with the present invention a hydrophobic photopolymerizable composition comprising at least one monomer and at least one polymeric binder and laminating the above described imaging element with its photopolymerizable composition onto a receptor layer or onto a pressure-adhesive or thermo-adhesive layer coated on a receptor layer.

According to the method for obtaining an image an imaging element as described above is image-wise or information-wise exposed to actinic radiation to harden the photopolymerizable composition pattern-wise. The exposure can be a contact exposure using e.g ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

It goes without saying that for said exposure any protective layer has to be transparent for said radiation.

Subsequent to the image-wise or information-wise exposure an image is obtained by (i) laminating said imaging element with its upper non-receptor layer to a receptor layer before or after said exposure and (ii) peeling away a receptor element comprising said receptor layer from the hydrophilic surface of the lithographic aluminum base thus transferring said hydrophobic photopolymerizable composition pattern-wise and the optional upperlying layer(s) to the receptor element and uncovering the image comprised of the lithographic aluminum base and the retained hydrophobic photopolymerizable composition.

When the imaging element does not comprise a pressure-adhesive layer said laminating is effected by means of a heating step, preferably at a temperature between 40° C. and 180° C., more preferably at a temperature between 65° C. and 120° C. Said heating may be applied to either or both the imaging element and the receptor element before, while or after bringing the receptor layer in contact with the upper non-receptor layer of the imaging element. As receptor element different kinds of cheap plain paper can be applied. A broad range of commercial papers with diverging physical properties can be used.

When the imaging element comprises a pressure-adhesive layer, said laminating requires a pressure step. Said pressure is applied while the receptor layer is in contact with the upper non-receptor layer of the imaging element.

An imaging element and a receptor element may be brought in contact before exposure. In such embodiment it is required that the receptor element is transparent for the radiation used for the exposure of the photopolymerizable composition.

An overall exposure, before or after the image-wise exposure can be applied to the imaging element, resulting in a higher sensitivity.

It may be advantageous to overall expose the lithographic printing plate to light and/or heat to enhance its stability. Such a procedure is especially preferred when the imaging element is positive working or to improve the scratch resistance of the lithographic printing plate.

Said lithographic printing plate can further be cleaned with water or an aqueous solution e. g. by wiping with a wet sponge, rinsing with a spray of unheated water or of an aqueous solution etc.

Because the imaging element according to the present invention comprises a hydrophobic photopolymerizable composition on a hydrophilic surface of a lithographic aluminum base, the obtained image can be used as a lithographic printing plate. Pattern-wise transfer of the photopolymerizable composition to a receptor material will then result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

The imaging element can be either positive working or negative working depending i.a. on the weight ratio in the hydrophobic photopolymerizable composition between monomer and (thermoplastic) polymer. For a negative working system said ratio is in general less than 1. For a positive working system said ratio is in general more than 2.

In a negative working imaging element according to the present invention the information-wise exposure to actinic radiation hardens the photopolymerizable composition pattern-wise in correspondence to the information-wise distribution of actinic radiation. Subsequent to the information-wise exposure the image is obtained by (i) laminating said imaging element with its upper non-receptor layer to a receptor layer before or after said exposure and (ii) peeling away a receptor element, comprising said receptor layer from the lithographic aluminum base, thereby transferring the non-hardened or insufficiently hardened parts of the hydrophobic photopolymerizable composition and the optional upperlying layer(s) to the receptor element and uncovering the image comprised of the hydrophilic surface of the lithographic aluminum base and the retained hardened parts of the hydrophobic photopolymerizable composition together with the underlying parts of the barrier layer.

In a positive working imaging element according to the present invention the information-wise exposure to actinic radiation hardens the photopolymerizable composition pattern-wise in correspondence to the information-wise distribution of actinic radiation. Subsequent to the information-wise exposure the image is obtained by (i) laminating said imaging element with its upper non-receptor layer to a receptor layer before or after said exposure and (ii) peeling away a receptor element, comprising said receptor layer from the hydrophilic surface of the lithographic aluminum base, thereby transferring the hardened parts of the hydrophobic photopolymerizable composition and the optional upperlying layer(s) to the receptor element and uncovering the image comprised of the hydrophilic surface of the lithographic aluminum base and the retained unhardened parts of the hydrophobic photopolymerizable composition together with the underlying parts of the barrier layer.

In another preferred embodiment according to the invention a negative-working photosensitive imaging element is provided comprising a lithographic aluminum base having a hydrophilic surface prepared according to the invention and applied thereto a hydrophobic photopolymerizable composition and containing at least one unsaturated compound with at least one polymerizable ethylenically unsaturated group, at least one hydrophobic thermoplastic polymer and at least one photoinitiator, wherein said hydrophobic photopolymerizable composition comprises in the order given (i) a polymerizable layer contiguous to said hydrophilic surface of the lithographic aluminum base and comprising at least part of said at least one unsaturated compound and (ii) a hydrophobic photosensitive layer contiguous to said polymerizable layer comprising at least part of said at least one hydrophobic thermoplastic polymer and of said at least one photoinitiator. Preferably, the photosensitive imaging element comprises on top of the photosensitive layer one or more protective layers selected from the group consisting of (i) a transfer layer which is capable of adhering to the underlying contiguous layer and to a receptor layer and (ii) a receptor layer which is capable of adhering to the underlying contiguous layer and which is upperlying said transfer layer if the latter is present. More details are given in EP-A-95202725.8. which therefor is incorporated herein by reference There is also provided in EP-A-95202725.8 a method for obtaining a lithographic printing plate with said imaging element comprising the steps of:

i) preparing an imaging element as described above, ii)image-wise or information-wise exposing said imaging element to actinic radiation, iii) laminating said imaging element with its photosensitive or thermosensitive side to a receptor element or layer before or after said exposure and iv) peeling away the receptor element from the hydrophilic surface of the lithographic aluminum base thus transferring said hydrophobic photosensitive or thermosensitive composition patternwise to the receptor element or layer.

In still another preferred embodiment there is provided a heat-sensitive imaging element comprising a lithographic aluminum base having a hydrophilic surface prepared according to the invention and applied thereto a hydrophobic heat-sensitive composition comprising a hydrophobic polymer binder, a compound capable of converting light into heat, and a reactive compound or mixture of reactive compounds present in an amount which surpasses the absorptive capacity of the hydrophobic polymer binder for said compound or mixture of compounds, the said reactive compound or mixture of compounds being reactive under the influence of heat or under the influence of a reagent which is obtained by decomposition of a heat sensitive compound.

According to the present invention there is also provided a method for obtaining a lithographic printing plate comprising the steps of:

i) preparing an imaging element as described above, ii)image-wise or information-wise exposing said imaging element to actinic radiation, iii) laminating said imaging element with its photosensitive or thermosensitive side to a receptor element or layer before or after said exposure and iv) peeling away the receptor element from the hydrophilic surface of the lithographic aluminum base thus transferring said hydrophobic photosensitive or thermosensitive composition patternwise to the receptor element or layer.

In still another preferred embodiment there is provided a method for obtaining a lithographic printing plate requiring no wet processing comprising the steps of image-wise exposing using a laser beam a heat mode recording material comprising on a flexible transparent support a recording composition comprising a hydrophobic thermal ablatable and/or transferrable compound and a substance capable of converting the laser beam radiation into heat while said heat mode recording composition is laminated to the hydrophilic surface of a lithographic aluminum base according to the invention separating said heat mode recording material from the hydrophilic surface of said lithographic aluminum base.

Said heat mode recording material can be assembled with the lithographic aluminum base at the factory or can be assembled by the printer, as long as the heat mode recording material is laminated to the hydrophilic surface of the lithographic aluminum base at the moment of the irradiation.

The following examples illustrate the present invention without limiting it thereto.

EXAMPLE 1

Preparation of the hydrophilic surface of a lithographic aluminum base.

An electrochemically grained and anodized aluminium sheet (obtained from KALLE type 7722 - 0.15 mm) was sealed for 30 sec. at 90° C. in demineralized water. Next said sealed aluminum sheet was treated in a 2.5% by weight aqueous solution of sodium silicate (weight ratio $SiO_2$/$Na_2O$=3.17) at 90° C. for a period of 5 minutes. Afterwards said treated aluminum sheet is rinsed with demineralised water of 20° C. during 120 seconds. In this way an insoluble hydrophilic, organophobic layer is formed on said aluminum sheet. This constitutes a hydrophilic surface of a lithographic aluminum base;

Preparation of the imaging element

Onto the above obtained hydrophilic surface of a lithographic aluminium base was coated a photosensitive composition consisting of a solution in methyl-ethyl keton of 1.0% by weight of SARTOMER 399 (dipentaerythritolpentaacrylate from CRAY VALLEY), 7.32% by weight of TONER RESIN TO 5154 (styrene - butylmethacrylate copolymer from DEGUSSA), 0.27% of a blue dye (C. I. 61551), 0.66% by weight of ortho-chlorohexaarylbisimidazole, 0.24% by weight of Michler's ketone and 0.07% by weight of mercaptobenzoxazole. The mixture was coated to a wet coating thickness of 30 $\mu$m. The above obtained imaging element was overcoated with a solution consisting of 20% by weight aqueous dispersion of Baystal P2000 (from Bayer AG, Germany) which is a copolymer containing styrene, butadiene and acrylic acid with a glass transition temperature of 34° C. (measured with the "1090 Thermolyzer" of Dupont Co.), a melt viscosity of more than 13420 Poise and an elasticity corresponding to a $(tg\delta)^{31\ 1}$ value of 3.54, both last properties measured at 120° C. (with the "viscoelastic melt tester" of Rheometrics Co., UK), to a wet coating thickness of 30 $g/m^2$.

On top of the imaging element was then placed in face-to-face contact a test target with a 60 lines per cm screen as well as fine positive and negative lines, and the imaging element was exposed therethrough to ultraviolet radiation.

The exposed imaging element was then placed in face-to-face contact with the receptor element, being a subbed polyethyleneterephtalate support (having an upper subbing layer containing gelatine and silica).

The contacting elements were conveyed through a roll laminator device at 90° C. and at a speed of 0.3 m/min. and the element was peeled apart wereby the non-exposed parts of the photosensitive layer are removed and the exposed areas remain on the lithographic aluminum base, thus being a negative working system.

A good image was obtained with a line reproduction for lines of 15 $\mu$m.

The obtained image on the hydrophilic base could be used to print on a conventional offset press using a commonly employed ink and fountain. Good copies were obtained with this sample.

EXAMPLE 2

To demonstrate the effect of the sealing/silicate treatment a comparative imaging element was prepared as described in example 1 except that the aluminium sheet was not sealed and treated with sodium silicate.

After exposing, laminating and delaminating the exposed areas as well as the non-exposed areas remain on the lithographic aluminum sheet resulting in no image formation.

EXAMPLE 3

To demonstrate the effect of the sealing treatment a comparative imaging element was prepared as described in example 1 except that the sealing step, prior to the sodium silicate treatment, was omitted.

After exposing, laminating and delaminating the exposed areas as well as the non-exposed areas were removed resulting in no image formation.

EXAMPLE 4

To demonstrate the effect of the silicate treatment a comparative imaging element was prepared as described in example 1 except that the sodium silicate treatment was omitted. After exposing, laminating and delaminating the exposed areas as well as the non-exposed areas remain on the lithographic aluminum sheet resulting in no image formation.

EXAMPLE 5

Preparation of the carbon black dispersion=CBD-I

A carbon black dispersion was prepared by dissolving 60 g of PLIOTONE 3015 (vinyltoluene - butadiene copolymer from GOODYEAR) in 900 g of methylethylketone in a ball mill and by adding 40 g of CORAX L6 (carbon pigment from DEGUSSA) and 0.5 g SOLSPERSE 24000 GR (dispersing aid from ZENECA RESINS). After 72 hours milling the dispersion was ready to use.

Preparation of the imaging element

On the grained, anodized and sealed aluminium foil , prepared as described in example 1, was coated a thermosensitive composition prepared by adding 5 g of 10% g/g solution of AIBN (2,2'-azobisisobutyronitrile from AKZO) in methylethylketone and 10 g of a 10% g/g solution of SARTOMER 399 (dipentaerythritolpentaacrylate from CRAY VALLEY) in methylethylketone to 85 g of the carbon black dispersion CBD-I. The mixture was coated to a wet coating thickness of 20 $\mu$m.

The above obtained imaging element was overcoated with a solution consisting of 20% by weight aqueous dispersion of Baystal P2000 (from Bayer AG, Germany) which is a copolymer containing styrene, butadiene and acrylic acid with a glass transition temperature of 34° C. (measured with the "1090 Thermolyzer" of Dupont Co.), a melt viscosity of more than 13420 Poise and an elasticity corresponding to a $(tg\ \delta)^{31\ 1}$ value of 3.54, both last properties measured at 120° C. (with the "viscoelastic melt tester" of Rheometrics Co., UK), to a wet coating thickness of 30 $g/m^2$. The imaging element was exposed with a NDYLF-laser at a speed of 8.8 m/s. The output power was varied from 0.29 W to 0.80 W. The spot size of the laser beam at $1/e^2$ yielded 14.9 $\mu$m. Single scan lines were imaged.

The exposed imaging element was then placed in face-to-face contact with the receptor element, being a subbed polyethyleneterephtalate support (having an upper subbing layer containing gelatine and silica). The contacting elements were conveyed through a roll laminator device at 90°

C. and at a speed of 0.3 m/min. and the element was peeled apart whereby the non-exposed parts of the thermosensitive layer are removed and the exposed areas remain on the hydrophilic surface of the lithographic aluminum base, thus being a negative working system.

A good image was obtained.

The obtained image on the hydrophilic base could be used to print on a conventional offset press using a commonly employed ink and fountain. Good copies were obtained with this sample.

EXAMPLE 6

To demonstrate the effect of the sealing/silicate treatment a comparative imaging element was prepared as described in example 5 except that the aluminium sheet was not sealed and treated with sodium silicate.

After exposing, laminating and delaminating, the exposed areas as well as the non-exposed areas remain on the lithographic aluminum sheet resulting in no image formation.

We claim:

1. A method for preparing a hydrophilic surface of an aluminum lithographic base comprising the steps of roughening and anodizing a side of an aluminum foil and sealing said side of the aluminum foil with hot demineralized water within a temperature range from 70° C. to 100° C. for at least 5 seconds and rinsing said side of the aluminum foil with demineralized water and between said hot demineralized water treatment and said rinsing with demineralized water, said side of the aluminum foil is treated with an aqueous silicate solution within a temperature range from 70° C. to 100° C. for at least 5 seconds.

2. A method for preparing a hydrophilic surface of an aluminum lithographic base according to claim 1 wherein said aluminum foil is treated with an aqueous silicate solution within a temperature range from 80° C. to 95° C.

3. A method for preparing a hydrophilic surface of an aluminum lithographic base according to claim 1 wherein said aluminum foil is treated with an aqueous silicate solution for a time between 10 seconds and 600 seconds.

4. A method for preparing a hydrophilic surface of an aluminum lithographic base according to claim 1 wherein the amount of silicate compound in said aqueous silicate solution is from 0.5% by weight to 10% by weight.

5. A method for preparing a hydrophilic surface of an aluminum lithographic base according to claim 1 wherein said anodized aluminum foil is sealed with with hot demineralised water within a temperature range from 85° C. to 95° C.

6. An imaging element comprising a lithographic aluminum base having a hydrophilic surface prepared according to claim 1 and a hydrophobic photosensitive or thermosensitive composition applied thereto.

7. An imaging element comprising a lithographic aluminum base having a hydrophilic surface prepared according to claim 1 and applied thereto a hydrophobic photopolymerizable composition comprising at least one monomer, at least one polymeric binder and at least one photoinitiator and on top of said photopolymerizable composition one or more transparent protective layers, one of them being an upper layer, selected from the group consisting of:

a transfer layer which is capable of adhering to the underlying contiguous layer and to a receptor layer, and a receptor layer which is capable of adhering to the underlying contiguous layer and which is upperlying said transfer layer(s) if any is present.

8. An imaging element comprising a lithographic aluminum base having a hydrophilic surface prepared according to claim 1 and applied thereto a hydrophobic photopolymerizable composition containing at least one unsaturated compound with at least one polymerizable ethylenically unsaturated group, at least one hydrophobic thermoplastic polymer and at least one photoinitiator, wherein said hydrophobic photopolymerizable composition comprises in the order given a polymerizable layer contiguous to said hydrophilic surface of the lithographic aluminum base and comprising at least part of said at least one unsaturated compound and a hydrophobic photosensitive layer contiguous to said polymerizable layer comprising at least part of said at least one hydrophobic thermoplastic polymer and of said at least one photoinitiator.

9. An imaging element comprising a lithographic aluminum base having a hydrophilic surface prepared according to claim 1 and applied thereto a hydrophobic heat sensitive composition comprising a hydrophobic polymer binder, a compound capable of converting light into heat, and a reactive compound or mixture of reactive compounds present in an amount which surpasses the absorptive capacity of the hydrophobic polymer binder for said compound or mixture of compounds, the said reactive compound or mixture of compounds being reactive under the influence of heat or under the influence of a reagent which is obtained by decomposition of a heat sensitive compound.

10. A method for obtaining a lithographic printing plate comprising the steps of i)image-wise or information-wise exposing an imaging element according to any of claims 6 to 9, iii) laminating the imaging element with its photosensitive or thermosensitive side to a receptor element or layer before or after said exposure and iv) peeling away the receptor element or layer from the hydrophilic surface of the lithographic aluminum base thus transferring said hydrophobic composition patternwise to the receptor element or layer.

11. A method for obtaining a lithographic printing plate comprising the steps of i) image-wise exposing using a laser beam a heat mode recording material comprising on a flexible transparent support a recording composition comprising a hydrophobic thermal ablatable and/or transferrable compound and a substance capable of converting the laser beam radiation into heat while said heat mode recording composition is laminated to a hydrophilic surface of a lithographic aluminum base according to claim 1, ii) separating said heat mode recording material from the hydrophilic surface of said lithographic aluminum base.

* * * * *